United States Patent
Kim et al.

(10) Patent No.: US 12,399,306 B2
(45) Date of Patent: Aug. 26, 2025

(54) FOLDABLE DISPLAY DEVICE

(71) Applicant: Samsung Display Co., Ltd., Yongin-si (KR)

(72) Inventors: Kyung-man Kim, Anyang-si (KR); Minsang Koo, Seongnam-si (KR); Sanghoon Kim, Hwaseong-si (KR); Min-Hoon Choi, Seoul (KR); Seongjin Hwang, Suwon-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 465 days.

(21) Appl. No.: 17/927,319

(22) PCT Filed: Aug. 5, 2020

(86) PCT No.: PCT/KR2020/010325
§ 371 (c)(1),
(2) Date: Nov. 22, 2022

(87) PCT Pub. No.: WO2021/241801
PCT Pub. Date: Dec. 2, 2021

(65) Prior Publication Data
US 2023/0224385 A1 Jul. 13, 2023

(30) Foreign Application Priority Data
May 26, 2020 (KR) .................. 10-2020-0063206

(51) Int. Cl.
*G02B 1/18* (2015.01)
*H04M 1/02* (2006.01)
(Continued)

(52) U.S. Cl.
CPC ............ *G02B 1/18* (2015.01); *H04M 1/0214* (2013.01); *H10K 59/87* (2023.02); *H10K 77/00* (2023.02)

(58) Field of Classification Search
CPC ......... G02B 1/18; G02B 1/14; H04M 1/0214; H04M 1/0268; H10K 59/87; H10K 77/00;
(Continued)

(56) References Cited

U.S. PATENT DOCUMENTS 9,572,267 B2    2/2017  Cho
10,401,906 B2   9/2019  Choi et al.
(Continued)

FOREIGN PATENT DOCUMENTS

CN    108091261 A    5/2018
CN    108475084 A    8/2018
(Continued)

OTHER PUBLICATIONS

International Search Report—PCT/KR2020/010325 dated Feb. 22, 2021, citing references listed within.

*Primary Examiner* — Marcos Batista
(74) *Attorney, Agent, or Firm* — CANTOR COLBURN LLP

(57) ABSTRACT

A foldable display device includes a window. The window includes a first sub window, a second sub window, and an adhesive layer for coupling the first sub window and the second sub window to each other. The first sub window includes a first base layer having light transmittance of 90% or more and a first anti-fingerprint layer disposed on an upper surface of the first base layer, and the second sub window includes a second base layer disposed on the first sub window. A contact angle of a folding area of an upper surface of the first sub window is less than a contact angle of a peripheral area of the upper surface of the first sub window.

20 Claims, 15 Drawing Sheets

(51) Int. Cl.
*H10K 59/80* (2023.01)
*H10K 77/00* (2023.01)

(58) Field of Classification Search
CPC ... H10K 2102/311; B32B 17/10; B32B 23/08;
B32B 27/28; B32B 27/30; B32B 27/34;
B32B 27/36; B32B 17/10779; B32B
27/08; B32B 27/285; B32B 27/308; B32B
27/365; B32B 7/12; G06F 1/1616; G06F
1/1652; G06F 1/1656; G06F 1/1681;
G09F 9/30; G09F 9/301
USPC ..................................... 455/575.3; 370/338
See application file for complete search history.

(56) References Cited

U.S. PATENT DOCUMENTS

| | | | |
|---|---|---|---|
| 10,696,011 B2 | 6/2020 | Kim | |
| 10,755,991 B2 | 8/2020 | Park et al. | |
| 10,920,014 B2 | 2/2021 | Jung et al. | |
| 10,948,630 B2 | 3/2021 | Kim et al. | |
| 11,099,607 B2 | 8/2021 | Kim et al. | |
| 11,301,070 B2 | 4/2022 | Kim | |
| 11,500,422 B2 | 11/2022 | Heo et al. | |
| 11,511,516 B2 | 11/2022 | Kim | |
| 2014/0065326 A1* | 3/2014 | Lee | G09F 9/301 428/12 |
| 2014/0118902 A1 | 5/2014 | Kim | |
| 2017/0373121 A1 | 12/2017 | Leng et al. | |
| 2019/0377386 A1 | 12/2019 | Heo et al. | |
| 2020/0323093 A1 | 10/2020 | Kim | |

FOREIGN PATENT DOCUMENTS

| | | |
|---|---|---|
| CN | 110599901 A | 12/2019 |
| CN | 111133406 A | 5/2020 |
| KR | 101243182 | 3/2013 |
| KR | 20200052016 | 5/2016 |
| KR | 101669026 | 10/2016 |
| KR | 1020170082430 | 7/2017 |
| KR | 1020180017953 A | 2/2018 |
| KR | 1020180039219 A | 4/2018 |
| KR | 1020190005671 A | 1/2019 |
| KR | 101959632 | 3/2019 |
| KR | 1020190059229 | 5/2019 |
| KR | 1020190102872 | 9/2019 |
| KR | 1020190130490 A | 11/2019 |
| KR | 1020200019000 | 2/2020 |
| KR | 1020200019025 | 2/2020 |

* cited by examiner

FOLDABLE DISPLAY DEVICE

CROSS-REFERENCE TO RELATED APPLICATIONS

This application claims priority to Korean Patent Application No. 10-2020-0063206, filed on May 26, 2020, and all the benefits accruing therefrom under 35 U.S.C. § 119, the content of which in its entirety is herein incorporated by reference.

TECHNICAL FIELD

Embodiments relates to a foldable display device, and more particularly, to a foldable display device including a partially replaceable window.

BACKGROUND ART

Electronic equipment such as smart phones, tablets, notebook computers, car navigation systems, and smart televisions is being developed. The electronic equipment may include a display device for providing information. The electronic equipment further includes various display modules in addition to the display device.

The electronic equipment may have various shapes according to their use. The electronic equipment including a foldable display device, a bending type display device, or a curved display device has been developed to satisfy user needs.

DISCLOSURE OF THE INVENTION

Technical Problem

An aspect of the present invention is to provide a foldable display device including a window having improved durability and easy replacement.

Technical Solution

A foldable display device according to the present invention includes: a display panel; and a window disposed on the display panel and including a folding area and a peripheral area. The window includes: a first sub window including a first base layer having light transmittance of 90 percentages (%) or more and a first anti-fingerprint layer disposed on an upper surface of the first base layer; a second sub window including a second base layer disposed on the first sub window; and an adhesive layer configured to couple the first sub window to the second sub window. A contact angle of the folding area of an upper surface of the first sub window is less than a contact angle of the peripheral area of the upper surface of the first sub window.

The contact angle of the folding area of the upper surface of the first sub window may be 62 degrees (°) or less.

Adhesive force of the folding area of the upper surface of the first sub window to the adhesive layer may be 150 gram-force per inch (gf/inch) or more.

The contact angle of the peripheral area of the upper surface of the first sub window may be 112° or more.

The first base layer may include polyimide, polycarbonate, polyamide, triacetylcellulose, or polymethylmethacrylate.

The second sub window may include polyethylene terephthalate.

The second sub window may further include at least one of a hard coating layer, a second anti-fingerprint layer, or an anti-reflection layer, which is disposed on an upper surface of the second base layer.

The second sub window may further include a second anti-fingerprint layer disposed on an upper surface of the second base layer, and the second anti-fingerprint layer may overlap the folding area and the peripheral area and have a substantially uniform thickness.

The first anti-fingerprint layer may include perfluoro polyether.

An atomic percent (at %) of fluorine in the folding area of the first anti-fingerprint layer may be less than an atomic percent (at %) of fluorine in the peripheral area of the first anti-fingerprint layer.

The atomic percent of fluorine in the folding area of the first anti-fingerprint layer may be less than an atomic percent of oxygen in the folding area of the first anti-fingerprint layer.

The first anti-fingerprint layer may not be disposed on at least partial area of the folding area of the upper surface of the first sub window.

In the folding area of the upper surface of the first sub window, an occupied area per unit area of the first anti-fingerprint layer on an area adjacent to the peripheral area may be less than the occupied area per unit area of the first anti-fingerprint layer on an area corresponding to a center of the folding area.

The foldable display device may further include a color filter disposed on the display panel.

The foldable display device may include an input sensor disposed on the display panel.

A foldable display device according to the present invention includes: a display panel; and a window disposed on the display panel and including a folding area and a peripheral area. The window includes: a first sub window including a first base layer having light transmittance of 90% or more and a perfluoro polyether layer disposed on an upper surface of the first base layer; a second sub window disposed on the first sub window; and an adhesive layer configured to couple the first sub window to the second sub window. Adhesive force of the folding area of an upper surface of the first sub window to the adhesive layer is greater than an adhesive force of the peripheral area of the upper surface of the first sub window.

The adhesive force of the folding area of the upper surface of the first sub window to the adhesive layer may be 150 gf/inch or more.

The adhesive force of the folding area of the upper surface of the first sub window to the adhesive layer may be 100 gf/inch or more greater than the adhesive force of the peripheral area of the upper surface of the first sub window.

An atomic percent of fluorine in the folding area of the perfluoro polyether layer may be less than an atomic percent of fluorine in the peripheral area of the perfluoro polyether layer.

The perfluoro polyether layer may not be disposed on at least partial area of the folding area of the upper surface of the first sub window.

Advantageous Effects

As described above, in the unfolded state, one area of the second sub window corresponding to one area of the peripheral area may start to be detached. The second sub window having the relatively weak coupling force may be easily delaminated together with the adhesive layer. Since the area having the relatively high coupling force is limited to the folding area, the second sub window or the first sub window may be effectively prevented from being damaged in the process of delaminating the second sub window.

During the inner folding, the large shear stress may occur in the folding area, and since the coupling force between the first sub window and the second sub window is relatively large in the folding area, even if the large shear stress is applied, the first sub window and the second sub window may not be delaminated from each other.

MODE FOR CARRYING OUT THE INVENTION

Figure 1A:
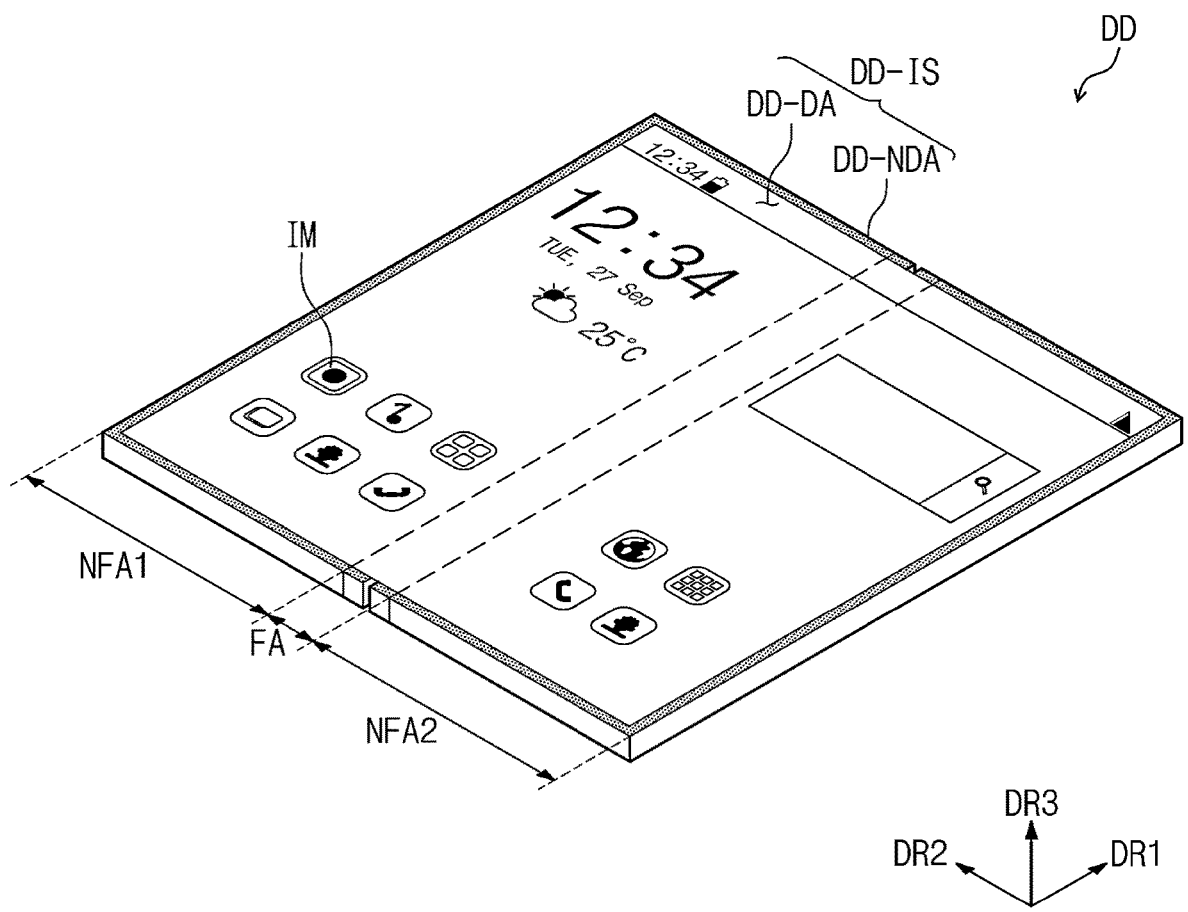
FIGS. 1A to 1C are perspective views of a display device according to an embodiment of the present invention.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration. The term "and/or" includes any and all combinations of one or more of the associated elements.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above', "upper", and the like are used for explaining relation association of the elements illustrated in the drawings. The terms may be a relative concept and described based on directions expressed in the drawings.

The meaning of "include" or "comprise" specifies a property, a fixed number, a step, an operation, an element, a component or a combination thereof, but does not exclude other properties, fixed numbers, steps, operations, elements, components or combinations thereof.

Unless otherwise defined, all terms (including technical and scientific terms) used herein have the same meaning as commonly understood by a person of ordinary skill in the art to which the present invention belongs. Also, terms such as defined terms in commonly used dictionaries are to be interpreted as having meanings consistent with meaning in the context of the relevant art and are expressly defined herein unless interpreted in an ideal or overly formal sense.

"About", "substantially" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "substantially" can mean within one or more standard deviations, or within ±30%, 20%, 10% or 5% of the stated value. Hereinafter, embodiments of the present invention will be described with reference to the accompanying drawings.

Figure 1B:
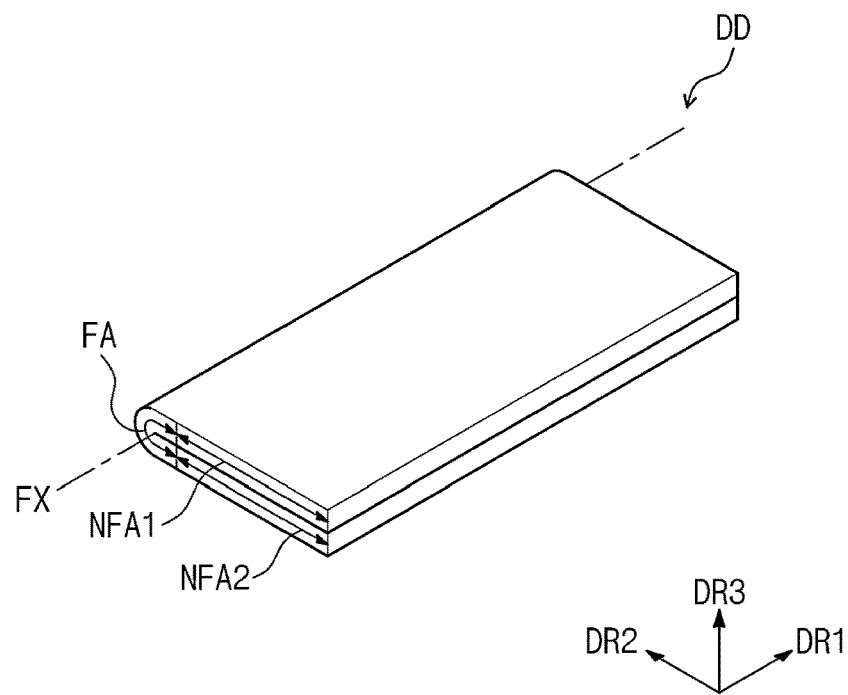
Figure 1C:
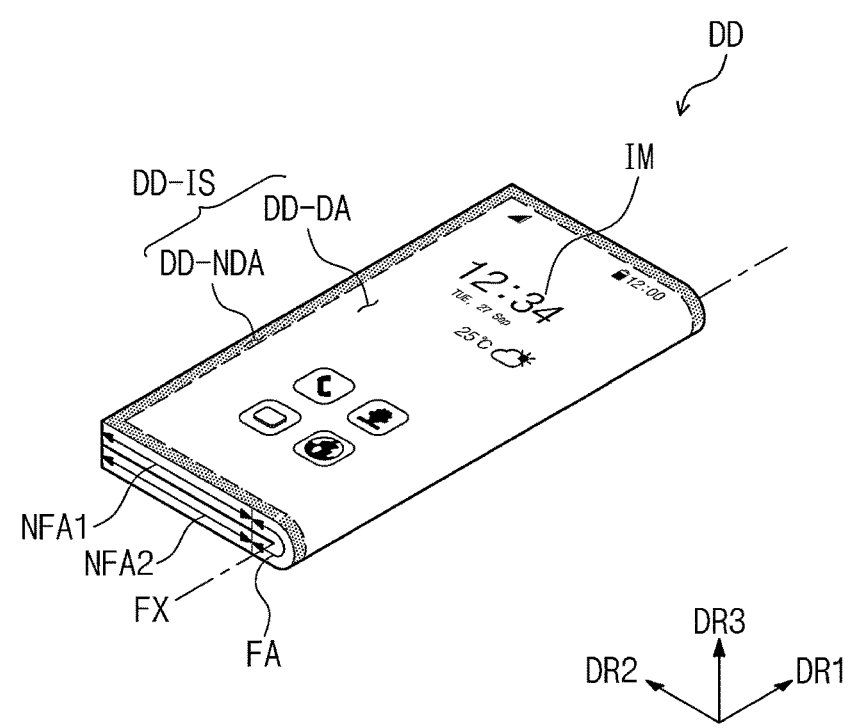

FIGS. 1A to 1C are perspective views of a display device according to an embodiment of the present invention.

As illustrated in FIGS. 1A to 1C, a display surface DD-IS is parallel to a surface defined by a first directional axis DR1 and a second directional axis DR2. A normal direction of the display surface DD-IS, i.e., a thickness direction of the display device DD is indicated as a third directional axis DR3. A front surface (or top surface) and a rear surface (or bottom surface) of each of members is distinguished based on the third directional axis DR3. Hereinafter, the first to third directions may be directions indicated by the first to third directional axes DR1, DR2, and DR3 and designated by the same reference numerals, respectively.

As illustrated in FIG. 1A to 1C, the display surface IS includes a display area DD-DA on which an image IM is displayed and a non-display area DD-NDA that is adjacent to the display area DD-DA. The non-display area DD-NDA may be an area on which an image is not displayed. FIGS. 1A to 1C illustrates an icon as an example of the image IM. For example, the display area DD-DA may have a rectangular shape. The non-display area DD-NDA may surround the display area DD-DA. However, an embodiment of the present invention is not limited thereto, and the display area DD-DA and the non-display area DD-NDA may be modified in shape.

As illustrated in FIGS. 1A to 1C, the display device DD may include a plurality of areas defined according to the forms of operations. The display device DD may include a folding area FA that is folded on the basis of the folding axis FX, a first peripheral area NFA1 adjacent to the folding area FA, and a second peripheral area NFA2. The folding area FA is an area that substantially forms a curvature.

As illustrated in FIG. 1B, the display device DD may be inner-folded or inner-bent so that the display surface DD-IS of the first peripheral area NFA1 and the display surface DD-IS of the second peripheral area NFA2 face each other. As illustrated in FIG. 1C, the display device DD may be outer-folded or outer-bent so that the display surface DD-IS is exposed to the outside. As illustrated in FIGS. 1A to 1C, the display module in which folding and unfolding repeatedly operate may be defined as a foldable display module.

In an embodiment of the present invention, the display device DD may include a plurality of folding areas FA. In addition, the folding areas FA may be defined to corresponding to a user's operation for manipulating the display device DD. For example, unlike FIGS. 1B and 1C, the folding area FA may be defined parallel to the second directional axis DR2 and may be defined in a diagonal direction in which the first directional axis DR1 and the second directional axis DR2 cross each other. The folding area FA may have a variable surface area and be determined according to a radius of curvature. In an embodiment of the present invention, the display device DD may be configured to repeat only an operation mode illustrated in FIGS. 1A and 1B or may be configured to repeat only an operation mode illustrated in FIGS. 1A and 1C.

Although a display device DD applied to the mobile phone is illustrated in this embodiment, the present invention is not limited thereto. In an embodiment of the present invention, the display device DD may be applied to large-sized electronic equipment such as televisions and monitors and small and middle-sized electronic equipment such as tablet PC, navigation systems for vehicles, game consoles, and smart watches.

FIGS. 2A to 2D are cross-sectional views of the display device DD according to an embodiment of the present invention. FIGS. 2A to 2D illustrate cross-sections defined by the second directional axis DR2 and the third directional axis DR3. FIGS. 2A to 2D are schematically illustrated to explain a lamination relationship of functional panels and/or functional units constituting the display device.

The display device DD according to an embodiment of the present invention may include a display panel, an input sensor, an anti-reflection unit, and a widow. At least portions of the display panel, the input sensor, the anti-reflection unit, and the window may be formed through a continuous process, and at least portions may be coupled to each other through an adhesive member. In FIGS. 2A to 2D, a pressure sensitive adhesive film ("PSA") is exemplarily illustrated as an adhesive member. The adhesive member described below may include an ordinary adhesive or pressure-sensitive adhesive, and is not particularly limited. In an embodiment of the present invention, the anti-reflection unit and the window may be replaced with different constituents or omitted.

In FIGS. 2A to 2D, corresponding constituents of the input sensor, the anti-reflection unit, and the window, which are formed with respect to the other constituent through the continuous process, may be expressed as "layers". Also, constituents of the input sensor, the anti-reflection unit, and the window, which are coupled to other constituents through the adhesive member, may be expressed as "panels". The "panels" may include a base layer providing a base surface, for example, a synthetic film, a complex material film, a glass substrate, and the like, but the base layer may be omitted in the "layers". That is to say, the members or units expressed as the "layers" may be disposed on the base surface provided by other members or units.

The input sensor and the anti-reflection unit may be referred to as an input sensing panel, an anti-reflection panel, an input sensing layer, or an anti-reflection layer according to the presence/absence of the base layer. In this embodiment, all windows are shown as a structure, in which a "panel" type is applied.

Figure 2A:
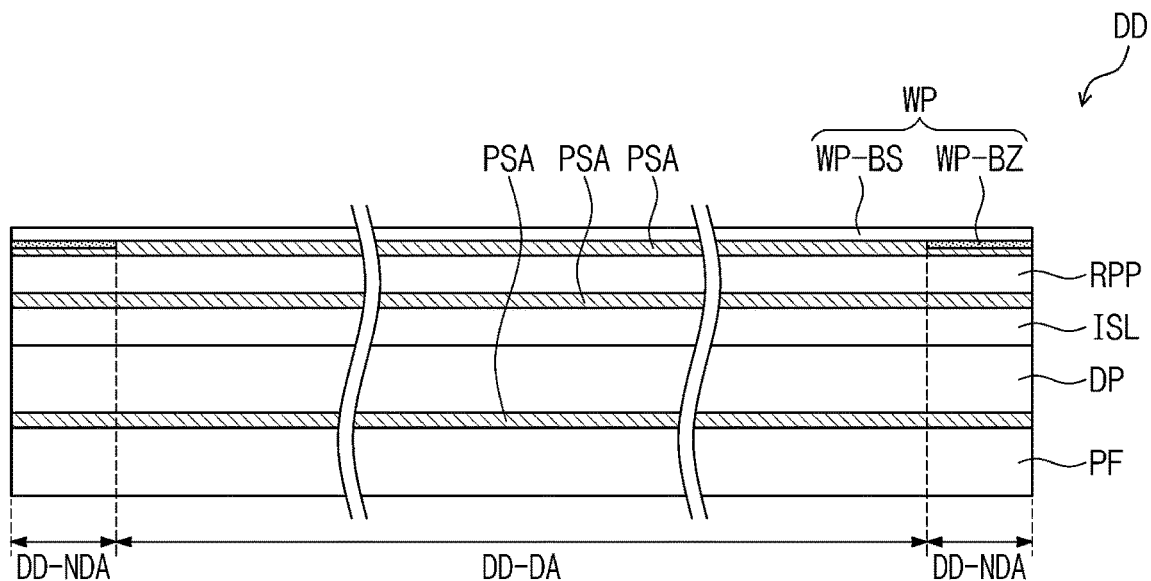
FIGS. 2A to 2D are cross-sectional views of the display device according to an embodiment of the present invention.
Figure 2A:
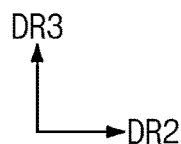

As illustrated in FIG. 2A, the display device DD may include a display panel DP, an input sensing layer ISL, an anti-reflection panel RPP, a window WP, and a protection member PF. In the display device DD, a coupling structure of constituents other than the window WP may be defined as a display module.

The input sensing layer ISL may be directly disposed on the display panel DP. In this specification, "a constituent B1 is directly disposed on a constituent A1" means that an adhesive member is not disposed between the constituent A1 and the constituent B1. The constituent B1 is formed on a base surface provided by the constituent A1 through a continuous process after the constituent A1 is formed. A pressure-sensitive adhesive film PSA is disposed between the anti-reflection panel RPP and the window WP, between the input sensing layer ISL and the anti-reflection panel RPP, and between the protection member PF and the display panel.

The display panel DP generates an image, and the input sensing layer ISL acquires coordinate information of an external input (for example, a touch event). The protection member PF supports the display panel DP and protects the display panel DP from an external impact. The protection member PF may include a plastic film as a base layer. A material for forming the protection member PF is not limited to plastic resins. For example, the protection member PF may be formed of an organic/inorganic composite material. The protection member PF may include a porous organic layer and an inorganic material that is filled into pores of the organic layer.

The display panel DP according to an embodiment of the present invention may be an emission-type display panel, but is not particularly limited thereto. For example, the display panel DP may be an organic light emitting display panel and a quantum-dot light emitting display panel. A light emitting layer of the organic light emitting display panel may include an organic light emitting material. An emission layer of the quantum dot light emitting display panel may include a quantum dot and/or a quantum rod. Hereinafter, the organic light emitting display panel will be described as an example of the display panel DP.

The anti-reflection panel RPP reduces reflectance of natural light (or sunlight) incident from an upper side of the window WP. The anti-reflection panel RPP according to an embodiment of the present invention may include a retarder and a polarizer. The retarder may be a film type or liquid crystal coating type retarder and may include a 212 retarder and/or a 214 retarder. The polarizer may also be provided in a film type or liquid crystal coating type polarizer. The film type may include an elongation-type synthetic resin, and the liquid crystal coating type may include liquid crystals that are arranged in a predetermined arrangement. Each of the retarder and the polarizer may further include a protection film. The retarder itself or the polarizer itself may be defined as the base layer of the anti-reflection panel RPP. The protection film may be defined as the base layer of the anti-reflection panel RPP.

The anti-reflection panel RPP according to an embodiment of the present invention may include color filters. The color filters may have predetermined arrangement. The color filters may be determined in arrangement in consideration of colors of light emitted from pixels provided in the display panel DP. The anti-reflection panel RPP may further include a black matrix adjacent to the color filters.

The window WP according to an embodiment of the present invention includes a base layer WP-BS and a light blocking pattern WP-BZ. The base layer WP-BS may have a multi-layered structure, which will be described in detail below. In an embodiment of the present invention, the light blocking pattern WP-BZ may be omitted.

Figure 2B:
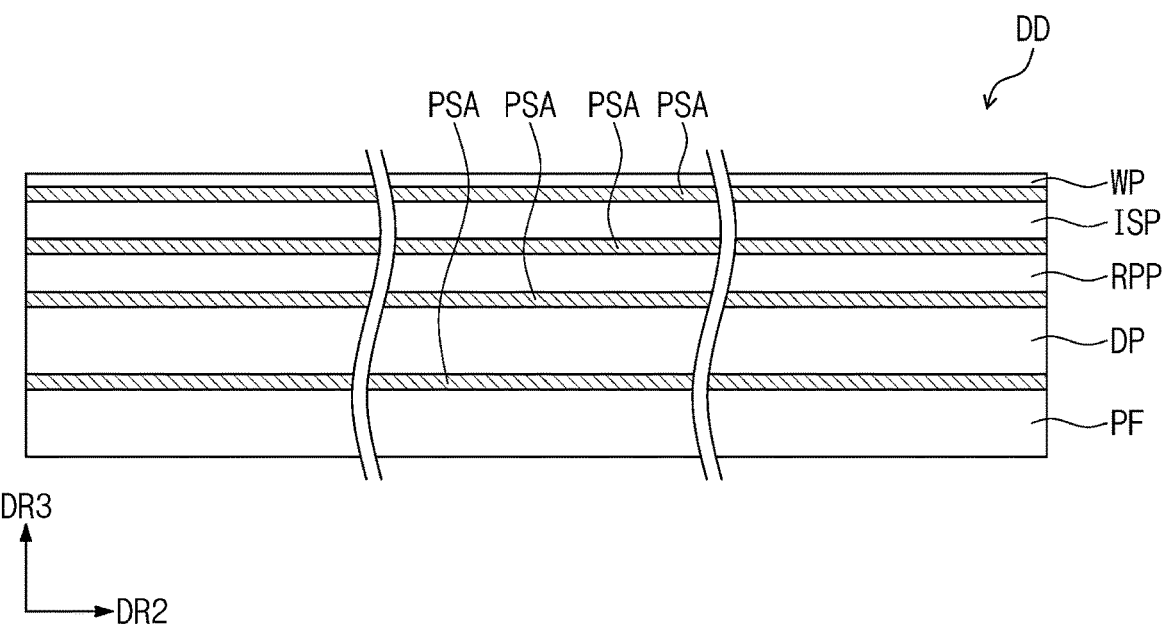
Figure 2B:
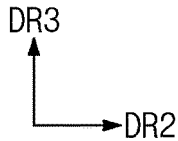
Figure 2C:
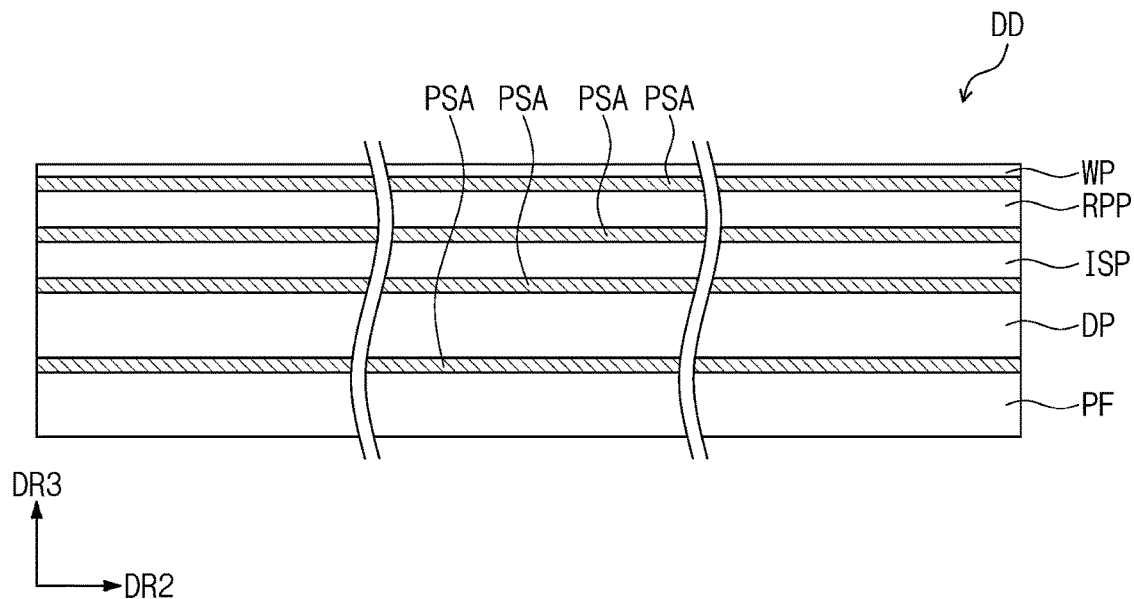
Figure 2D:
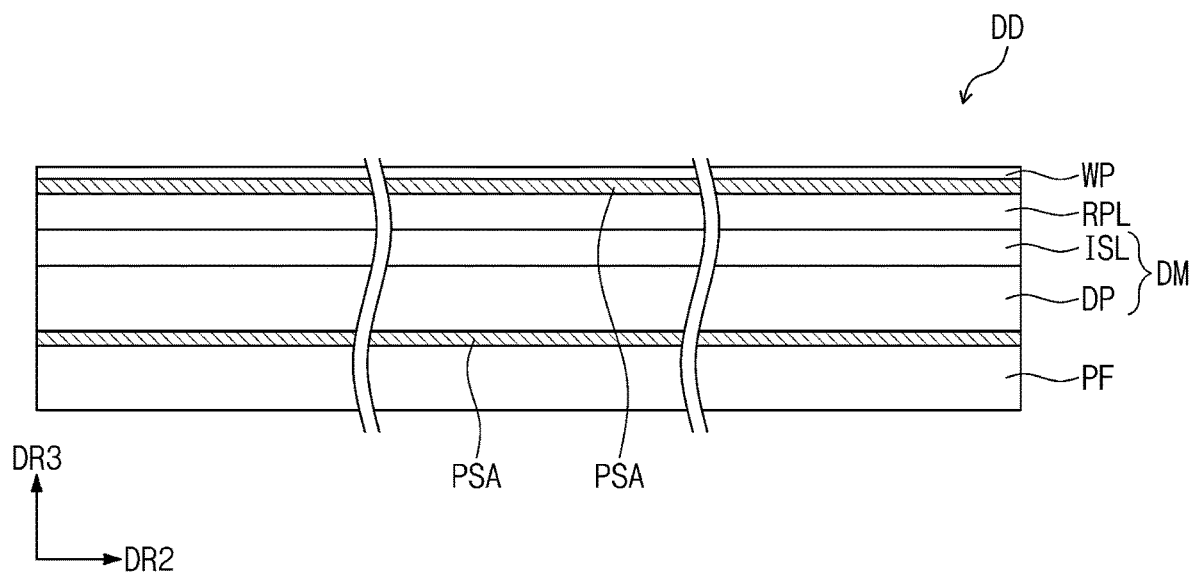

The light blocking pattern WP-BZ partially overlaps the base layer WP-BS. The light blocking pattern WP-BZ may be disposed on a rear surface of the base layer WP-BS to define a bezel area of the display device DD, i.e., a non-display area DD-NDA (see FIG. 1). The light blocking pattern WP-BZ may be a colored organic film, for example, be formed in a coating manner. In FIGS. 2B to 2D, the window WP is schematically illustrated without distinguishing the base layer WP-BS and the light blocking pattern WP-BZ from each other.

Referring to FIGS. 2B and 2C, the display device DD may include a protection member PF, a display panel DP, an anti-reflection panel RPP, an input sensing panel ISP, and a window WP. A laminated order of the input sensing panel ISP and the anti-reflection panel RPP may be changed.

As illustrated in FIG. 2D, the display device DD may include a protection member PF, a display panel DP, an input sensing layer ISL, an anti-reflection layer RPL, and a window WP. Most of the adhesive members may be omitted from the display device DD, and the input sensing layer ISL and the anti-reflection layer RPL may be formed through the continuous process on the base surface provided to the display panel DP. A laminated order of the input sensing layer ISL and the anti-reflection panel RPP may be changed.

In an embodiment of the present invention, the anti-reflection layer RPL may include a liquid crystal coating-type retarder and a liquid crystal coating type polarizer. The retarder and the polarizer may include a discotic liquid crystal layer having a tilt angle in one direction. In an embodiment of the present invention, the anti-reflection layer RPL may include color filters. The color filters may constitute a separate and distinct layer, but may also form a portion of the input sensing layer ISL. It is sufficient if the color filters are disposed between the display panel DP and the window WP.

Figure 3:
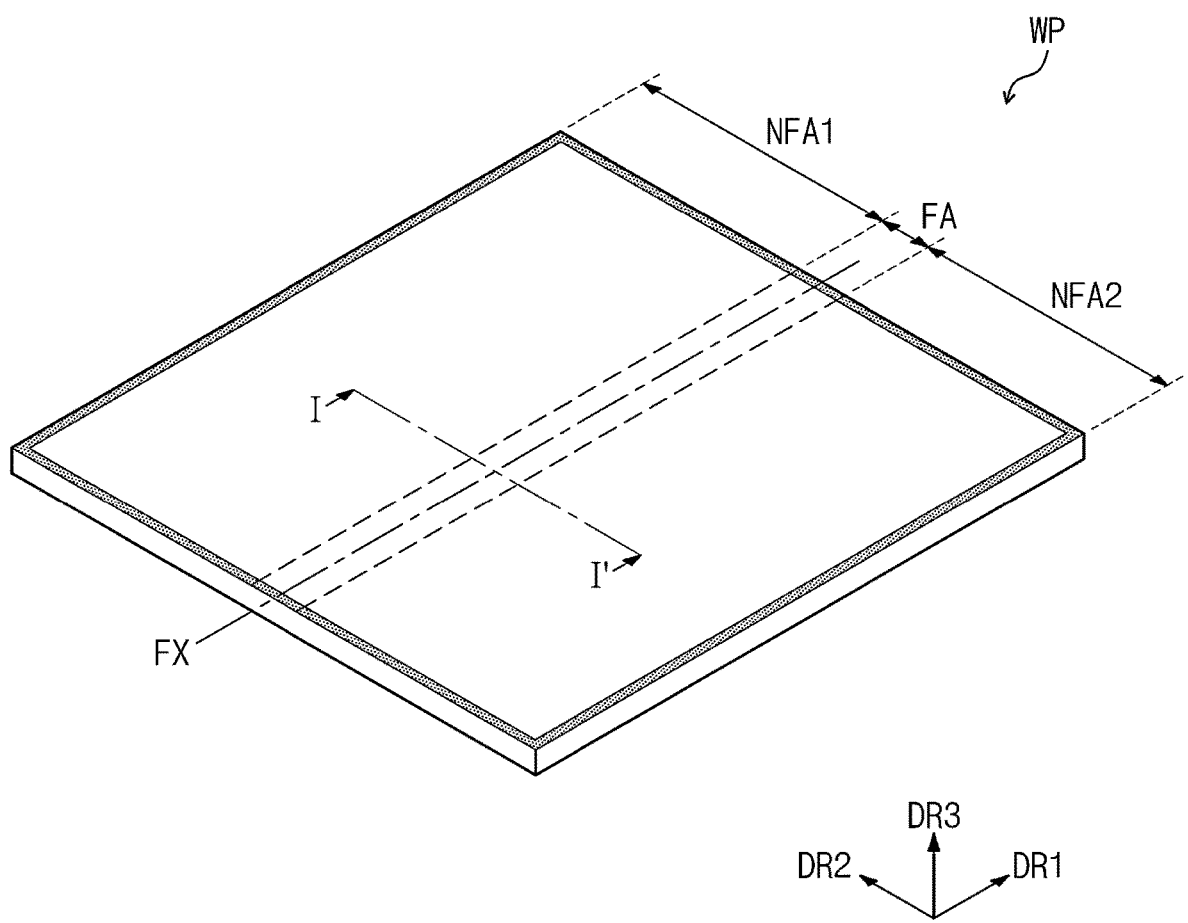
FIG. 3 is a perspective view of a window according to an embodiment of the present invention.
Figure 4A:
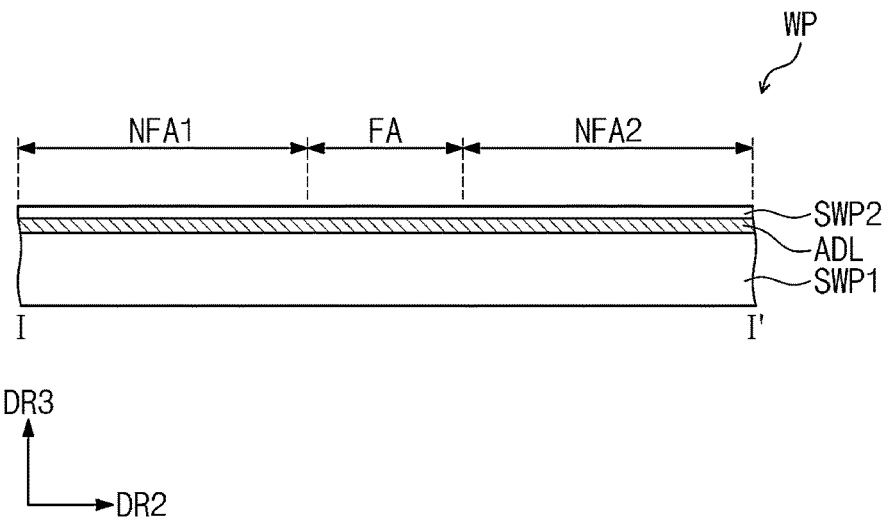
FIG. 4A is a cross-sectional view illustrating a state in which the window is unfolded according to an embodiment of the present invention.
Figure 4B:
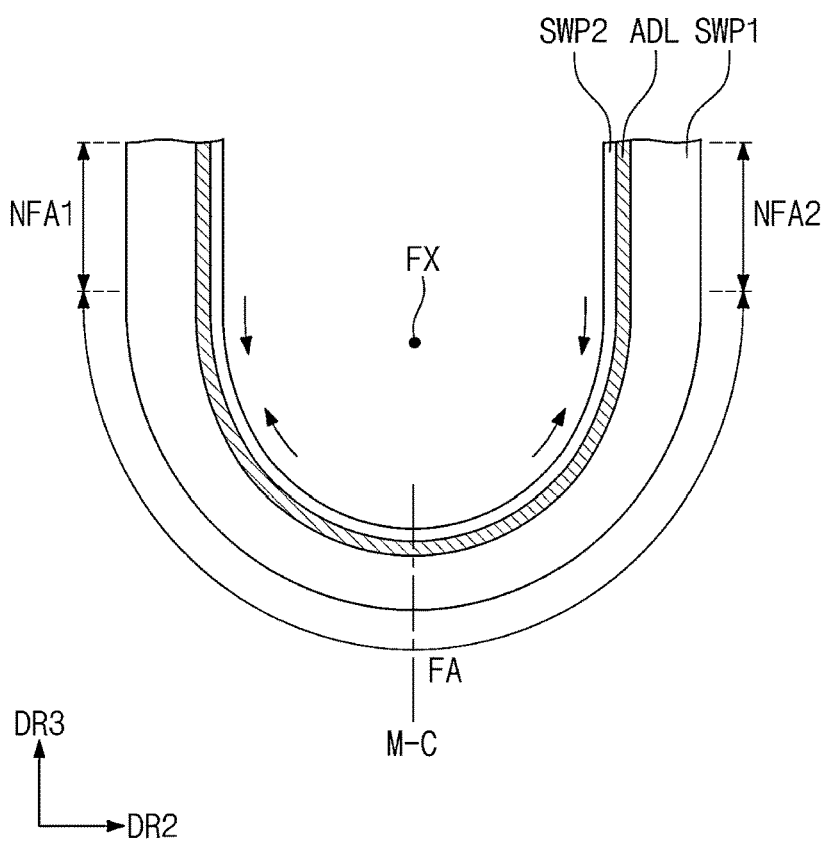
FIG. 4B is a cross-sectional view illustrating a state in which the window is inner-folded according to an embodiment of the present invention.
Figure 5A:
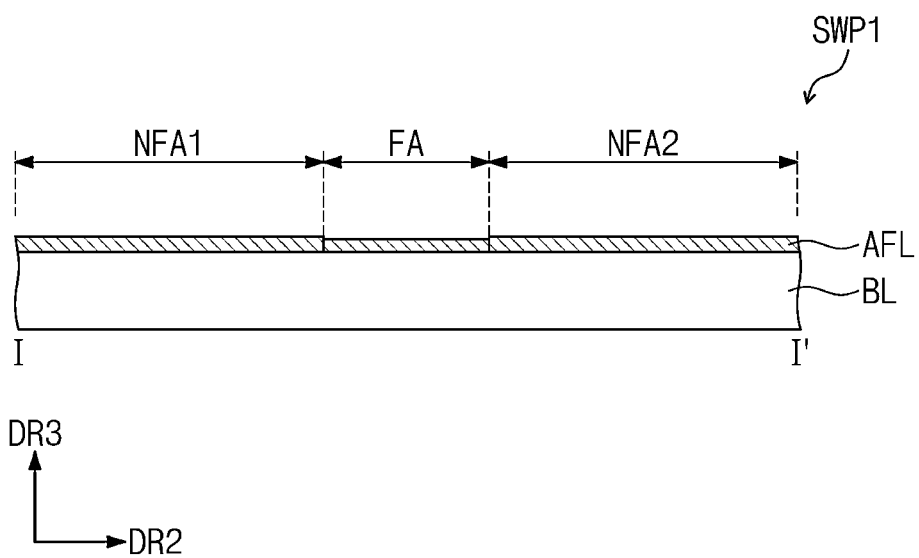
FIG. 5A is a cross-sectional view of a first sub window according to an embodiment of the present invention.
Figure 5B:
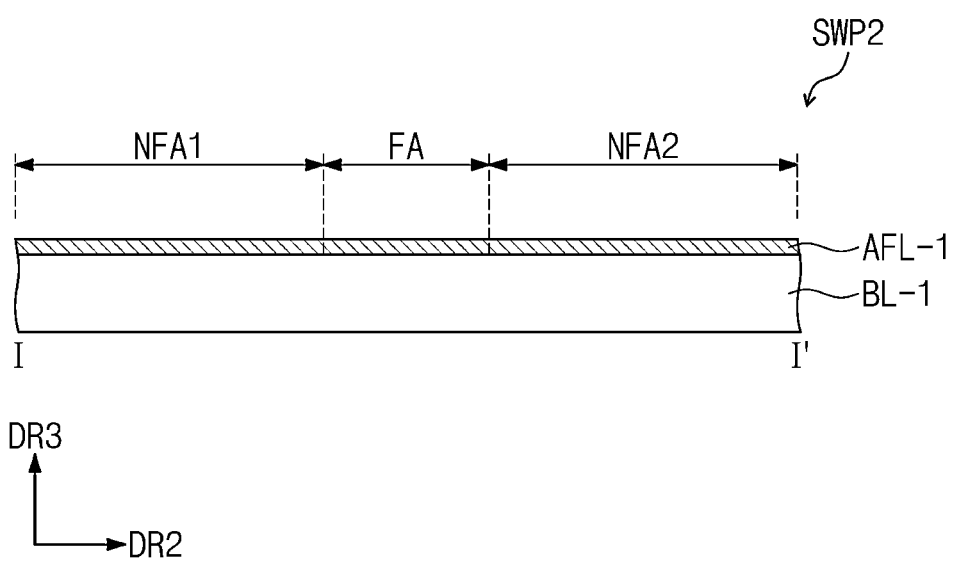
FIG. 5B is a cross-sectional view of a second sub window according to an embodiment of the present invention.
Figure 6A:
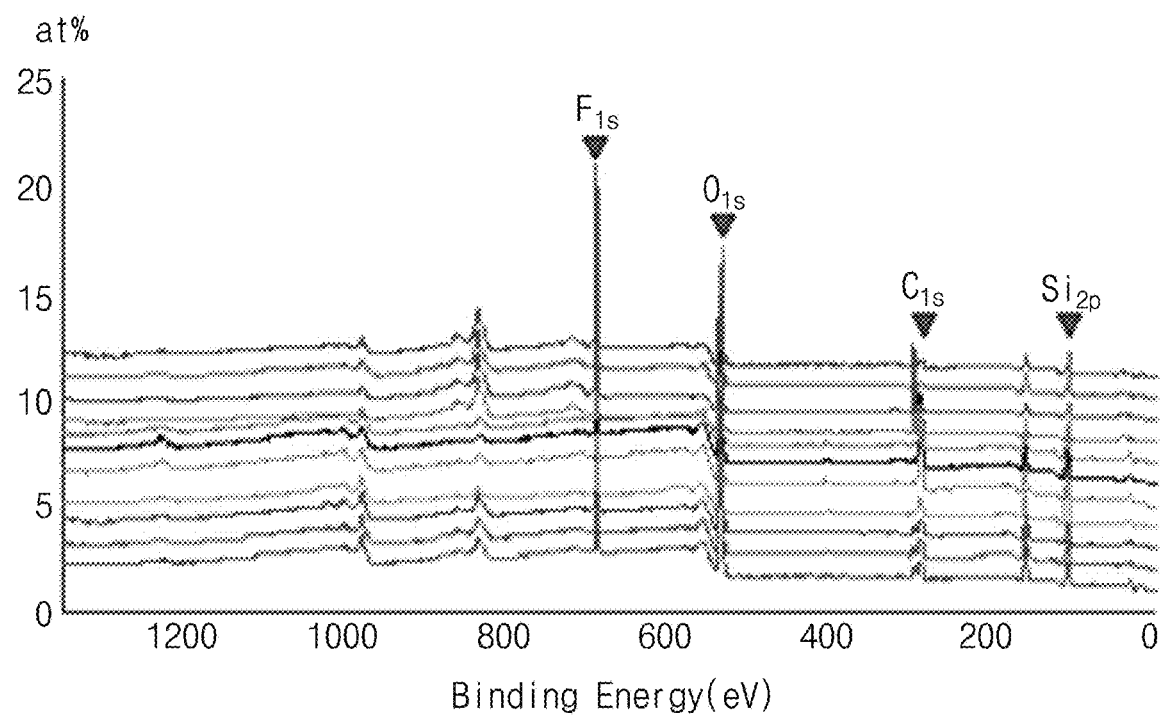
FIG. 6A is a view illustrating results obtained through an X-ray photoelectron spectroscopy ("XPS") for analyzing a remaining amount of an anti-fingerprint layer.
Figure 6B:
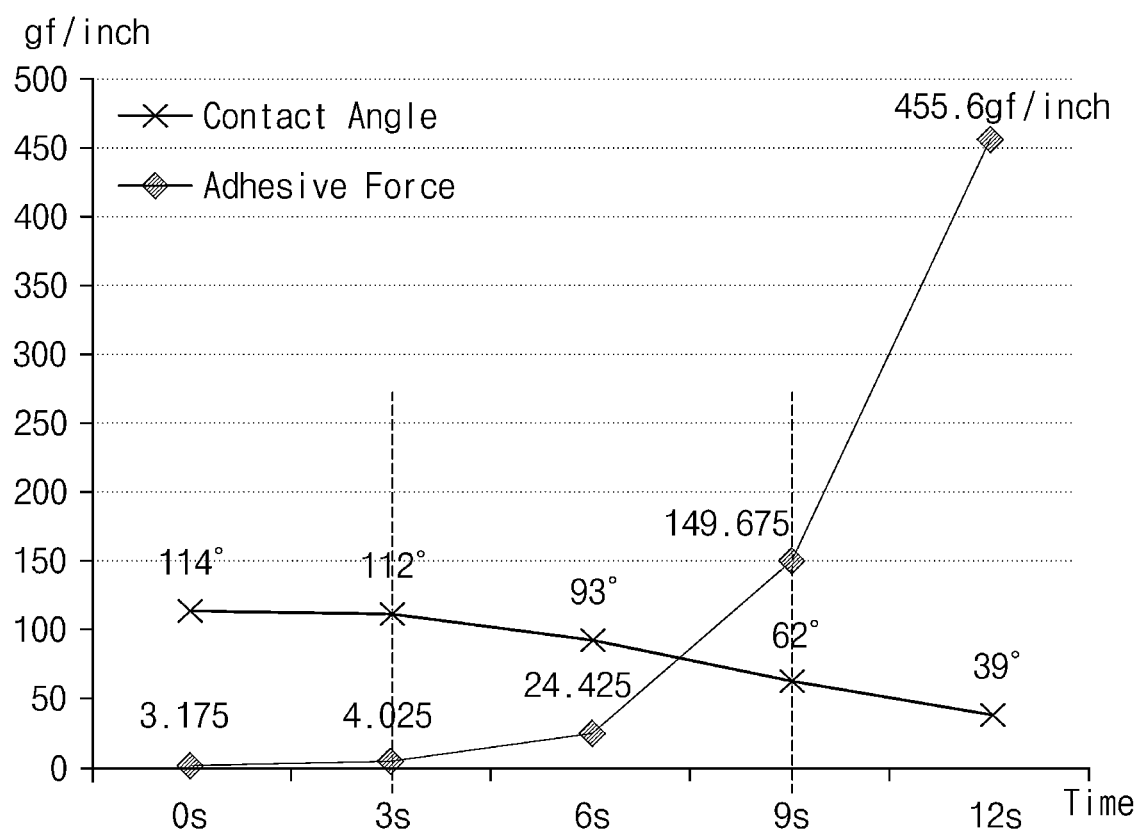
FIG. 6B is a graph illustrating a contact angle and adhesive force of a first sub window according to a plasma treatment time.

FIG. 3 is a perspective view of the window according to an embodiment of the present invention. FIG. 4A is a cross-sectional view taken along line I-I' of FIG. 3, illustrating a state in which the window is unfolded according to an embodiment of the present invention. FIG. 4B is a cross-sectional view illustrating a state in which the window is inner-folded according to an embodiment of the present invention. FIG. 5A is a cross-sectional view of a first sub window according to an embodiment of the present invention. FIG. 5B is a cross-sectional view of a second sub window according to an embodiment of the present invention. FIG. 6A is a view illustrating results obtained through an X-ray photoelectron spectroscopy ("XPS") for analyzing a remaining amount of an anti-fingerprint layer. FIG. 6B is a graph illustrating a contact angle and adhesive force of a first sub window according to a plasma treatment time. All the windows WP described below may be applied to the display device DD described with reference to FIGS. 2A to 2D.

As illustrated in FIG. 3, the window WP may include a folding area FA, a first peripheral area NFA1 adjacent to the folding area FA, and a second peripheral area NFA2 opposite to the first peripheral area NFA1 with respect to the folding area FA. Substantially, the folding area FA, the first peripheral area NFA1, and the second peripheral area NFA2 of the window WP may be the same as the folding area FA, the first peripheral area NFA1, and the second peripheral area NFA2, respectively, which are described with reference to FIGS. 1A to 1C, and thus, the same reference numerals are cited.

As illustrated in FIGS. 4A and 4B, the window WP may include a first sub window SWP1 (or inner window), a second sub window SWP2 (or outer window) disposed on the first sub window SWP1, and an adhesive layer ADL disposed between the first sub window SWP1 and the second sub window SWP2 to couple the first sub window SWP1 to the second sub window SWP2.

The second sub window SWP2 may be delaminated from the first sub window SWP1 together with the adhesive layer ADL. When scratches or dent defects occur in the window WP due to the external impact, the second sub window SWP2 may be delaminated together with the adhesive layer ADL from the first sub window SWP1, and a new second sub window SWP2 may be coupled to the first sub window SWP1. That is, the second sub window SWP2 has a function of a replaceable protection layer or protection window.

The second sub window SWP2 includes at least a base layer. The base layer may have light transmittance of at least 90% or more. The second sub window SWP2 may include a plastic film as the base layer. In an embodiment, for example, the second sub window SWP2 may include polyethylene terephthalate.

The second sub window SWP2 may further include at least one of a hard coating layer, an anti-fingerprint layer, or an anti-reflection layer, which is disposed on the base layer. The at least one of the hard coating layer, the anti-fingerprint layer, or the anti-reflection layer may be disposed on an upper surface of the base layer of the second sub window SWP2.

As illustrated in FIG. 4B, stress is concentrated to the folding area FA during the inner folding. The first sub window SWP1 according to this embodiment may be applied to the window WP to facilitate replacement of the second sub window SWP2 and improve durability of the window WP. Thus, defects due to the stress generated during the inner folding may be prevented. This will be described in more detail with reference to FIG. 5A.

Referring to FIG. 5A, the first sub window SWP1 may include a base layer BL and an anti-fingerprint layer AFL disposed on an upper surface of the base layer BL. The anti-fingerprint layer AFL may be formed differently according to areas.

The base layer BL may have light transmittance of at least 90% or more. The base layer BL may include a plastic film. For example, the base layer BL may include polyimide, polycarbonate, polyamide, triacetylcellulose, or polymethylmethacrylate. In an embodiment of the present invention, the base layer BL may include a glass substrate. A thickness of the base layer BL may be 250 micrometers ($\mu$m) or less.

The anti-fingerprint layer AFL controls coupling force between the first sub window SWP1 and the second sub window SWP2 according to the areas. The coupling force may be determined by a contact angle of the first sub window SWP1, and the contact angle may vary depending on formation conditions of the anti-fingerprint layer AFL or plasma treatment conditions for the anti-fingerprint layer AFL.

For convenience of description, an area corresponding to the folding area FA of the upper surface of the first sub window SWP1 and areas corresponding to the peripheral areas NFA1 and NFA2 of the upper surface of the first sub window SWP1 are described as the folding area FA of the first sub window SWP1 and the peripheral areas NFA1 and NFA2 of the first sub window SWP1, respectively.

A contact angle of the folding area FA of the first sub window SWP1 is less than a contact angle of each of the peripheral areas NFA1 and NFA2 of the first sub window SWP1. This is because the anti-fingerprint layer AFL has different conditions according to the folding area FA and the peripheral areas NFA1 and NFA2 of the first sub window SWP1. The anti-fingerprint layer AFL may have different film quality, film density, film thickness, occupied area per unit area, etc., according to the areas. In FIG. 5A, a thickness of the anti-fingerprint layer AFL in the folding area FA is reduced compared to the peripheral areas NFA1 and NFA2 is illustrated as an example.

As illustrated in FIG. 5A, the anti-fingerprint layer AFL may substantially cover the peripheral areas NFA1 and NFA2. The folding area FA of the anti-fingerprint layer AFL has been subjected to plasma treatment in a greater amount (e.g., time) than each of the peripheral areas NFA1 and NFA2 of the anti-fingerprint layer AFL.

The coupling force between the first sub window SWP1 and the second sub window SWP2 in the folding area FA that has been relatively heavily plasma-treated is stronger than the coupling force between the first sub window SWP1 and the second sub window SWP2 in the peripheral areas NFA1 and NFA2 that has been relatively lightly plasma-treated. The anti-fingerprint layer AFL is damaged by the plasma treatment, and thus, since an atomic percent (at %) of fluorine is lowered, it has a small contact angle. The thickness of the folding area FA of the anti-fingerprint layer AFL may be reduced by the plasma treatment.

In this embodiment, the anti-fingerprint layer AFL may include perfluoro polyether.

In FIG. 6A, at % of fluorine was measured using XPS. At % of each of fluorine, silicon, and oxygen was measured according to the areas. According to Table 1, 4 points were measured on the peripheral areas NFA1 and NFA2, and 4 points were measured on the folding area FA.

TABLE 1

|  | F1s(at %) | O1s(at %) | C1s(at %) | Si2p(at %) |
|---|---|---|---|---|
| First point on peripheral area | 44.66 | 28.80 | 15.26 | 11.28 |
| Second point on peripheral area | 45.91 | 29.07 | 14.08 | 10.94 |
| Third point on peripheral area | 38.61 | 34.46 | 13.11 | 13.83 |
| Fourth point on peripheral area | 38.62 | 34.68 | 13.12 | 13.57 |
| First point on folding area | 18.48 | 45.44 | 13.57 | 22.50 |
| Second point on folding area | 17.64 | 45.72 | 13.49 | 23.15 |
| Third point on folding area | 18.16 | 45.60 | 14.13 | 22.11 |
| Fourth point on folding area | 9.81 | 50.26 | 14.20 | 25.73 |

Referring to Table 1, an atomic percent (at %) of fluorine in the folding area FA is less than an atomic percent (at %) of oxygen in the folding area FA. An atomic percent of silicon is increased in the folding area FA compared to the peripheral areas NFA1 and NFA2. Referring to FIG. 6B, as a plasma treatment time increases, the contact angle decreases, and the coupling force increases. In an embodiment, the contact angle of the folding area FA of the first sub window SWP1 may be about 62 degrees (°) or less. The adhesive force of the folding area FA of the first sub window SWP1 to the adhesive layer ADL (see FIG. 4A) may be about 150 gram-force per inch (gf/inch) or more. In this embodiment, the contact angle of each of the peripheral areas NFA1 and NFA2 of the first sub window SWP1 may be 112° or more. The contact angle of each of the peripheral areas NFA1 and NFA2 of the first sub window SWP1 may be 112° to 120°. The adhesive force of the folding area FA of the first sub window SWP1 to the adhesive layer ADL (see FIG. 4A) may be about 4 gf/inch or less.

The adhesive force of the first sub window SWP1 to the adhesive layer ADL on the area corresponding to the folding area FA may be greater at least 100 gf/inch or more than that corresponding to each of the peripheral areas NFA1 and NFA2 of the first sub window SWP1.

A process of delaminating the first sub window SWP1 from the second sub window SWP2 will be described with reference to FIG. 4A. As illustrated in FIG. 4A, in the unfolded state, one area of the second sub window SWP2, which corresponds to one area of each of the peripheral areas NFA1 and NFA2 may start to be detached. The second sub window SWP2 having relatively weak coupling force may be easily delaminated together with the adhesive layer ADL. As in the structure described with reference to FIG. 5A, since the area having the relatively large coupling force is limited to the folding area FA, the second sub window SWP2 or the first sub window SWP1 may be effectively prevented from being damaged in the process of delaminating the second sub window SWP2.

As illustrated in FIG. 4B, large shear stress occurs in the folding area FA during the inner folding. Since the folding area FA has the relatively large coupling force, the first sub window SWP1 and the second sub window SWP2 may be prevented from being delaminated by the shear stress.

As illustrated in FIG. 5B, the second sub window SWP2 may include a base layer BL-1 and an anti-fingerprint layer AFL-1. Unlike the anti-fingerprint layer AFL of the first sub window SWP1, the anti-fingerprint layer AFL-1 of the second sub window SWP2 may have a substantially uniform condition. The anti-fingerprint layer AFL-1 of the second sub window SWP2 may have substantially uniform film quality, film density, film thickness, or area occupied by the anti-fingerprint material per unit area regardless of areas.

FIGS. 7A to 7D are cross-sectional views illustrating a method for manufacturing a first sub window according to an embodiment of the present invention. FIGS. 8A and 8B are plan views of masks MSK1 and MSK2 according to an embodiment of the present invention.

Figure 7A:
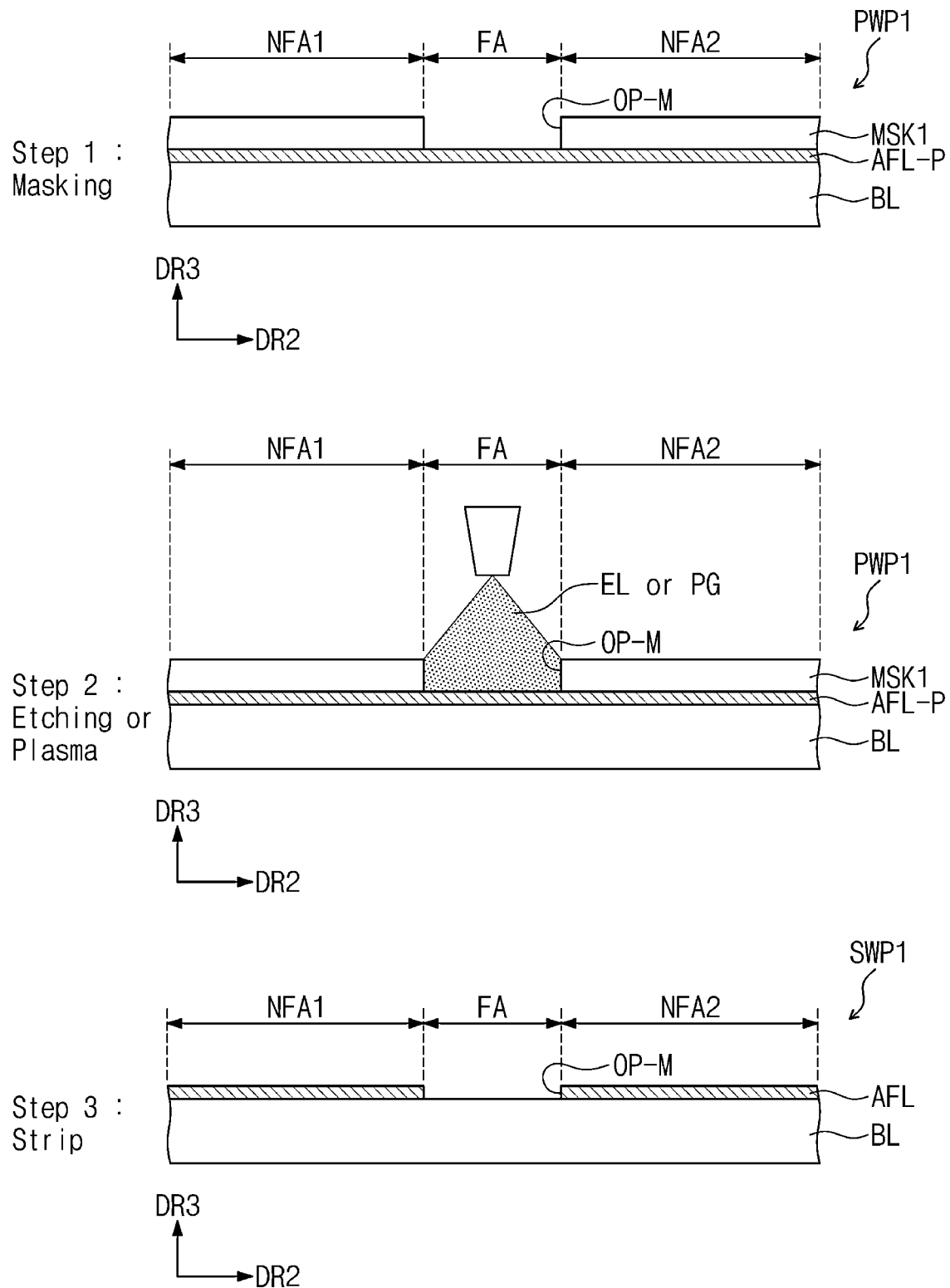
FIGS. 7A to 7D are cross-sectional views illustrating a method for manufacturing a first sub window according to an embodiment of the present invention.
Figure 8A:
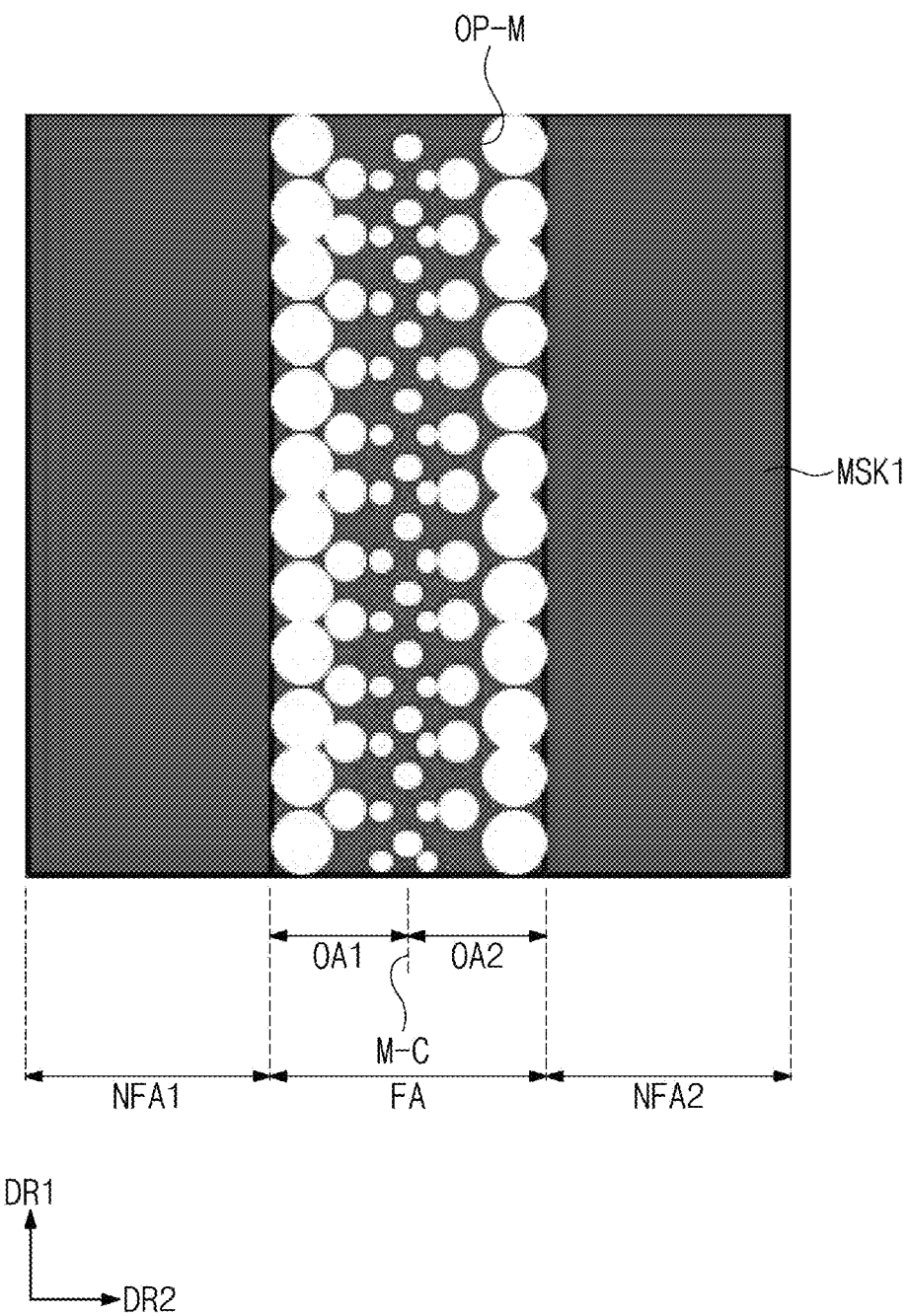
FIGS. 8A and 8B are plan views of a mask according to an embodiment of the present invention.
Figure 8B:
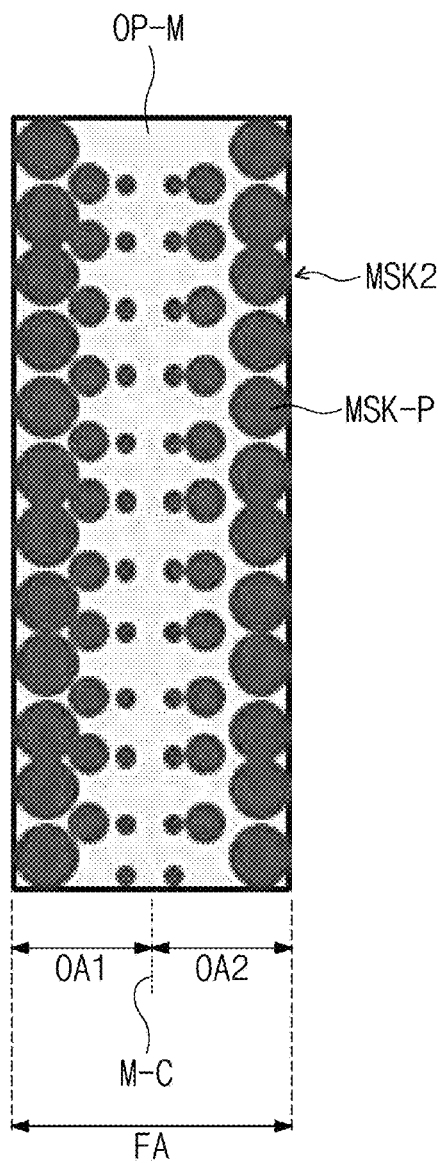

Referring to FIG. 7A, first, a preliminary-first window PWP1 in which a preliminary-anti-fingerprint layer AFL-P is formed on a base layer BL is provided. A mask MSK1 is disposed on the preliminary-first window PWP1. The mask MSK1 may include a plastic film, a polymer layer, a photoresistor, or a SUS.

Next, the preliminary-first window PWP1 is etched or plasma-treated. A portion of the preliminary-anti-fingerprint protection layer AFL-P exposed from the mask MSK1 may be etched using an etching solution EL such as a strong acid solution or a strong base solution. A partial area of the preliminary-anti-fingerprint protection layer AFL-P exposed from the mask MSK1 may be plasma-treated using a plasma gas PG such as hydrogen fluoride. The preliminary-anti-fingerprint layer AFL-P on the area exposed from the mask MSK1 may be partially removed or completely removed. An example in which the preliminary-anti-fingerprint layer AFL-P is completely removed in this embodiment is illustrated.

Thereafter, when the mask MSK1 is removed, a first sub window SWP1 is formed.

Figure 7B:
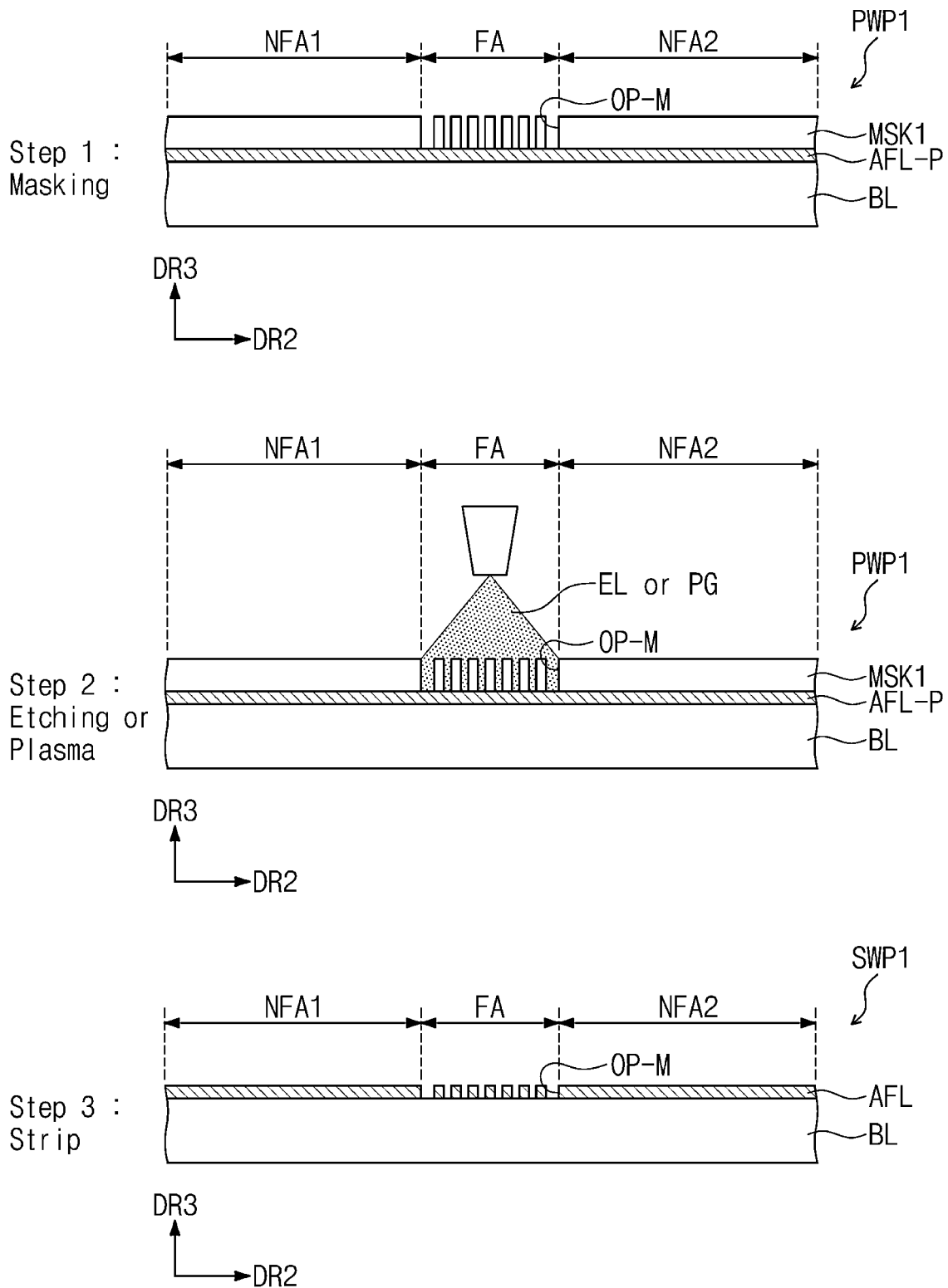

Referring to FIG. 7B, the above-described manufacturing method is substantially similar to the manufacturing method of FIG. 7A. However, a planar shape of the mask MSK1 is partially different. FIG. 7A exemplarily illustrates a mask MSK1 having one opening OP-M corresponding to a folding area FA. According to this embodiment, the mask MSK1 provides a plurality of openings OP-M to correspond to the folding area FA. A planar shape of each of the plurality of openings OP-M may be the same as or different from each other.

A partial area of the preliminary-anti-fingerprint layer AFL-P exposed by the plurality of openings OP-M may be completely removed or partially removed. The anti-fingerprint layer AFL is not disposed on at least a portion of the folding area FA. A contact angle of the folding area FA of the anti-fingerprint layer AFL may be determined according to a degree of etching or plasma treatment.

Referring to FIG. 8A, the plurality of openings OP-M are arranged in a predetermined rule. An area corresponding to the folding area FA of the mask MSK1 may be divided into two areas OA1 and OA2. In the second direction DR2, a surface area of the opening OP-M of each of the two areas OA1 and OA2 increases as a distance from a center M-C of the mask MSK1 or the folding area FA increases. As the surface area of the opening OP-M increases, a surface area of the anti-fingerprint layer AFL decreases. In the anti-fingerprint layer AFL formed using the mask MSK1 of FIG. 8A, an area adjacent to each of the peripheral areas NFA1 and NFA2 has the lowest occupied area per unit area. On the contrary, coupling force of the area adjacent to each of the peripheral areas NFA1 and NFA2 is the greatest. As described with reference to FIG. 4B, even when the large shear stress occurs in the area adjacent to each of the peripheral areas NFA1 and NFA2 of the folding area FA, the first sub window SWP1 and the second sub window SWP2 may be prevented from being delaminated.

Unlike the embodiment illustrated in FIGS. 7A and 7B, the preliminary-anti-fingerprint layer AFL-P may be patterned by etching or plasma-treating a predetermined area without the mask MSK1.

Figure 7C:
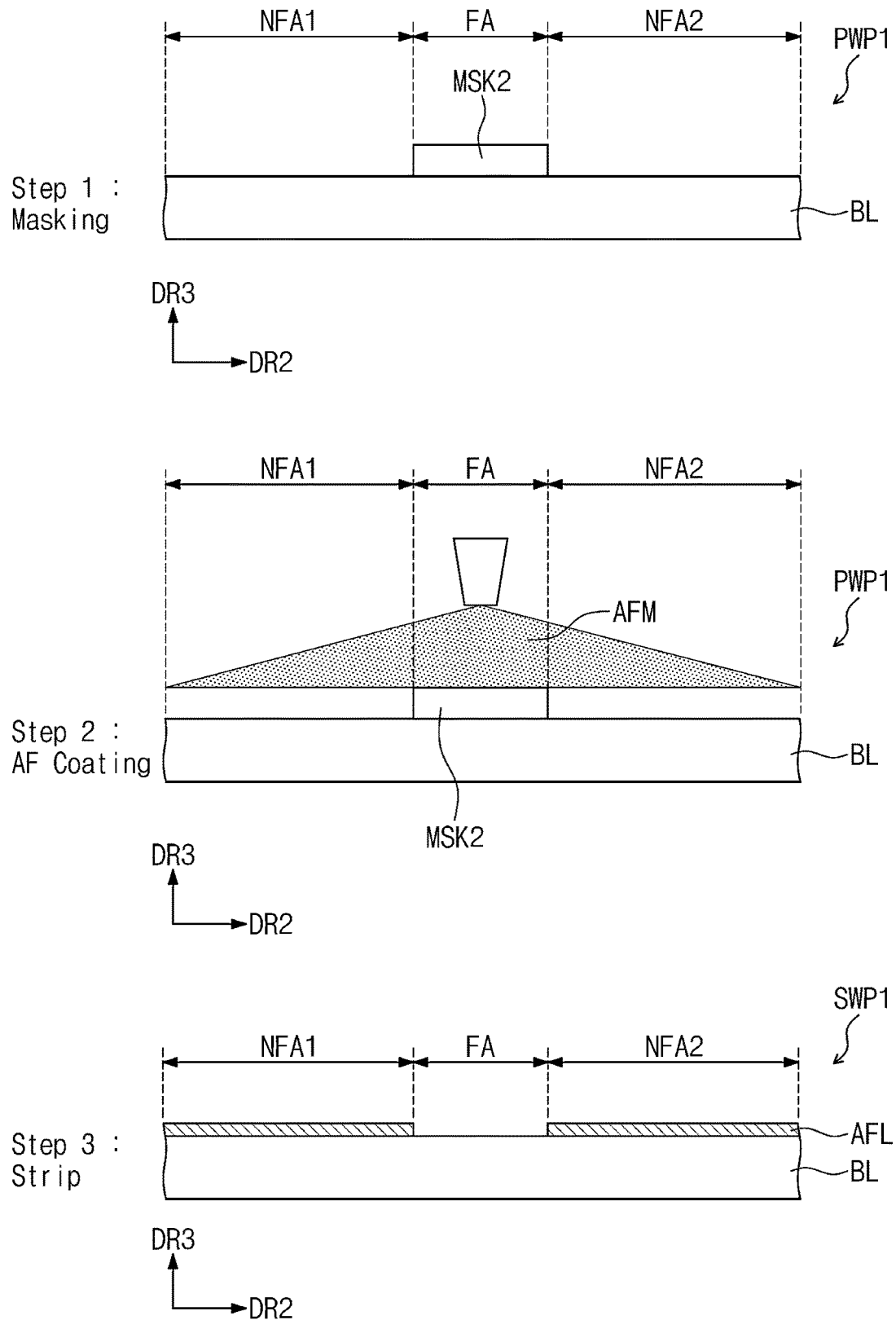

Referring to FIG. 7C, first, a base layer BL is provided. A mask MSK2 is disposed on the base layer BL.

Next, an anti-fingerprint material AFM is applied on the base layer BL. The coating method may be any one of wet coating, dry coating, and inkjet coating. An anti-fingerprint layer AFL is formed except for the area on which the mask MSK2 is disposed. A shape of the area on which the anti-fingerprint layer AFL is not disposed is determined according to a shape of the mask MSK2.

Thereafter, when the mask MSK2 is removed, the first sub window SWP1 is formed.

Figure 7D:
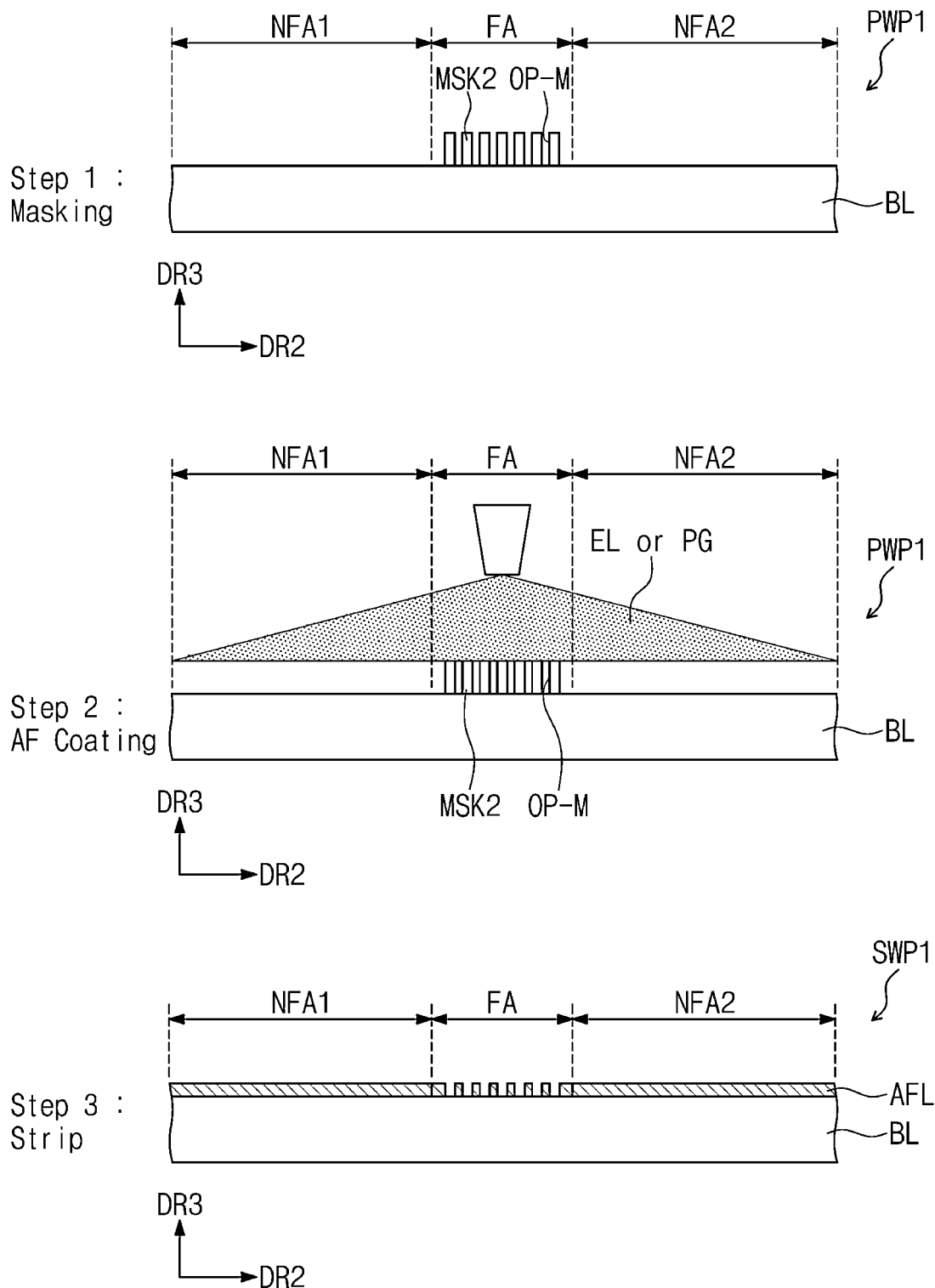

Referring to FIG. 7D, the above-described manufacturing method is substantially similar to the manufacturing method of FIG. 7C. However, the mask MSK2 having a different planar shape is used. FIG. 7C exemplarily illustrates a mask MSK2 corresponding to the folding area FA. According to this embodiment, the mask MSK2 includes at least one opening OP-M disposed to correspond to the folding area FA.

A partial area of the anti-fingerprint layer AFL may be formed on the area exposed by the opening OP-M. The anti-fingerprint layer AFL may be disposed on only a portion of the folding area FA.

Referring to FIG. 8B, a plurality of mask patterns MSK-P are arranged in a predetermined rule. An area corresponding to the folding area FA of the mask MSK2 may be divided into two areas OA1 and OA2. In the second direction DR2, a surface area of the mask pattern MSK-P each of the two areas OA1 and OA2 increases as a distance from a center M-C of the mask MSK2 or the folding area FA increases. As the surface area of the mask patterns MSK-P increases, a surface area of the anti-fingerprint layer AFL decreases.

In the anti-fingerprint layer AFL formed using the mask MSK2 of FIG. 8B, an area adjacent to each of the peripheral areas NFA1 and NFA2 has the lowest occupied area per unit area. In the area corresponding to the folding area FA of the anti-fingerprint layer AFL of the first sub window SWP1, the occupied area per unit area of the area adjacent to each of the peripheral areas NFA1 and NFA2 is less than the occupied area per unit area of the area corresponding to the center M-C of the folding area FA.

A method for detecting the anti-fingerprint layer AFL described with reference to FIGS. 7A to 7D is as follows. For example, the anti-fingerprint layer AFL according to this embodiment may be detected by measuring the contact angle. In addition, the anti-fingerprint layer AFL disposed on the first sub window SWP1 according to this embodiment may be detected using a heating type humidifier. In addition, the anti-fingerprint layer AFL may be detected using an XPS detection method. In addition, the anti-fingerprint layer AFL may be detected using TEM.

It will be apparent to those skilled in the art that various modifications and deviations can be made in the present invention. Thus, it is intended that the present invention covers the modifications and deviations of this invention provided they come within the scope of the appended claims and their equivalents.

Accordingly, the technical scope of the present invention should not be limited to the contents described in the detailed description of the specification, but should be determined by the claims.

INDUSTRIAL APPLICABILITY

The development of foldable display devices is being activated. A foldable display device including a window having improved durability and easy replacement is recognized for industrial applicability. It is possible to extend a lifespan of the foldable display device by replacing only some components.

The invention claimed is:
1. A foldable display device comprising:
a display panel; and
a window disposed on the display panel and comprising a folding area and a peripheral area,
wherein the window comprises:
  a first sub window comprising a first base layer having light transmittance of 90 percentages (%) or more and a first anti-fingerprint layer disposed on an upper surface of the first base layer;
  a second sub window comprising a second base layer disposed on the first sub window; and
  an adhesive layer configured to couple the first sub window to the second sub window,
  wherein a contact angle of the folding area of an upper surface of the first sub window is less than a contact angle of the peripheral area of the upper surface of the first sub window.
2. The foldable display device of claim 1, wherein the contact angle of the folding area of the upper surface of the first sub window is 62 degrees (°) or less.
3. The foldable display device of claim 2, wherein an adhesive force of the folding area of the upper surface of the first sub window to the adhesive layer is 150 gram-force per inch (gf/inch) or more.

4. The foldable display device of claim 1, wherein the contact angle of the peripheral area of the upper surface of the first sub window is 112° or more.

5. The foldable display device of claim 1, wherein the first base layer comprises polyimide, polycarbonate, polyamide, triacetylcellulose, or polymethylmethacrylate.

6. The foldable display device of claim 1, wherein the second sub window comprises polyethylene terephthalate.

7. The foldable display device of claim 1, wherein the second sub window further comprises at least one of a hard coating layer, a second anti-fingerprint layer, or an anti-reflection layer, which is disposed on an upper surface of the second base layer.

8. The foldable display device of claim 1, wherein the second sub window further comprises a second anti-fingerprint layer disposed on an upper surface of the second base layer, and
the second anti-fingerprint layer overlaps the folding area and the peripheral area and has a substantially uniform thickness.

9. The foldable display device of claim 1, wherein the first anti-fingerprint layer comprises perfluoro polyether.

10. The foldable display device of claim 9, wherein an atomic percent (at %) of fluorine in the folding area of the first anti-fingerprint layer is less than an atomic percent (at %) of fluorine in the peripheral area of the first anti-fingerprint layer.

11. The foldable display device of claim 10, wherein the atomic percent of fluorine in the folding area of the first anti-fingerprint layer is less than an atomic percent of oxygen in the folding area of the first anti-fingerprint layer.

12. The foldable display device of claim 1, wherein the first anti-fingerprint layer is not disposed on at least partial area of the folding area of the upper surface of the first sub window.

13. The foldable display device of claim 1, wherein, in the folding area of the upper surface of the first sub window, an occupied area per unit area of the first anti-fingerprint layer on an area adjacent to the peripheral area is less than the occupied area per unit area of the first anti-fingerprint layer on an area corresponding to a center of the folding area.

14. The foldable display device of claim 1, further comprising a color filter disposed on the display panel.

15. The foldable display device of claim 1, comprising an input sensor disposed on the display panel.

16. A foldable display device comprising:
a display panel; and
a window disposed on the display panel and comprising a folding area and a peripheral area,
wherein the window comprises:
a first sub window comprising a first base layer having light transmittance of 90% or more and a perfluoro polyether layer disposed on an upper surface of the first base layer;
a second sub window disposed on the first sub window; and
an adhesive layer configured to couple the first sub window to the second sub window,
wherein an adhesive force of the folding area of an upper surface of the first sub window to the adhesive layer is greater than an adhesive force of the peripheral area of the upper surface of the first sub window.

17. The foldable display device of claim 16, wherein the adhesive force of the folding area of the upper surface of the first sub window to the adhesive layer is 150 gf/inch or more.

18. The foldable display device of claim 17, wherein the adhesive force of the folding area of the upper surface of the first sub window to the adhesive layer is 100 gf/inch or more greater than the adhesive force of the peripheral area of the upper surface of the first sub window.

19. The foldable display device of claim 16, wherein an atomic percent of fluorine in the folding area of the perfluoro polyether layer is less than an atomic percent of fluorine in the peripheral area of the perfluoro polyether layer.

20. The foldable display device of claim 16, wherein the perfluoro polyether layer is not disposed on at least partial area of the folding area of the upper surface of the first sub window.

* * * * *